United States Patent
Lu et al.

(10) Patent No.: US 11,688,604 B2
(45) Date of Patent: Jun. 27, 2023

(54) METHOD FOR USING ULTRA THIN RUTHENIUM METAL HARD MASK FOR ETCHING PROFILE CONTROL

(71) Applicant: Tokyo Electron Limited, Tokyo (JP)

(72) Inventors: Yen-Tien Lu, Albany, NY (US); Kai-Hung Yu, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 157 days.

(21) Appl. No.: 16/582,297

(22) Filed: Sep. 25, 2019

(65) Prior Publication Data

US 2021/0028017 A1    Jan. 28, 2021

Related U.S. Application Data

(60) Provisional application No. 62/880,256, filed on Jul. 30, 2019, provisional application No. 62/878,900, filed on Jul. 26, 2019.

(51) Int. Cl.
*H01L 21/033* (2006.01)
*H01L 21/311* (2006.01)
(Continued)

(52) U.S. Cl.
CPC ...... *H01L 21/0337* (2013.01); *H01L 21/0332* (2013.01); *H01L 21/31144* (2013.01); *H01L 21/32136* (2013.01); *H01L 21/76802* (2013.01)

(58) Field of Classification Search
CPC ............ H01L 21/0337; H01L 21/0332; H01L 21/31144; H01L 21/32136;
(Continued)

(56) References Cited

U.S. PATENT DOCUMENTS

| 5,492,855 A | * | 2/1996 | Matsumoto | ....... H01L 21/32135 216/6 |
| 2003/0059720 A1 | * | 3/2003 | Hwang et al. | .......... H01L 28/60 430/311 |

(Continued)

FOREIGN PATENT DOCUMENTS

| KR | 20150068920 A | * | 6/2015 | ....... H01L 21/67069 |
| KR | 1020150068920 A | | 6/2015 | |
| WO | WO-2021021456 A1 | * | 2/2021 | ........... H01L 21/033 |

OTHER PUBLICATIONS

Korean Intellectual Property Office, The International Search Report and the Written Opinion for International application No. PCT/US2020/042322, dated Oct. 27, 2020, 10 pg.

*Primary Examiner* — Thanhha S Pham

(57) ABSTRACT

A method of processing substrates, in one example microelectronic workpieces, is disclosed that includes forming a multi-layer metal hard mask (MHM) layer in which at least one lower layer of the multi-layer MHM is comprised of ruthenium (Ru). The Ru MHM layer may be an atomic layer deposition (ALD) Ru MHM layer formed over one or more underlying layers on a substrate. The ALD Ru MHM layer may be etched to provide a patterned ALD Ru MHM layer, and then the one or more underlying layers may be etched using, at least in part, the patterned ALD Ru MHM layer as a mask to protect portion of the one or more underlying layers. In one embodiment, at least one of the underlying layers is a hard mask layer.

15 Claims, 7 Drawing Sheets

(51) Int. Cl.
*H01L 21/768* (2006.01)
*H01L 21/3213* (2006.01)

(58) Field of Classification Search
CPC ......... H01L 21/76802; H01L 21/76811; H01L 21/0334; H01L 21/0338; H01L 21/76807; H01L 21/311
USPC ....................................................... 438/703
See application file for complete search history.

(56) References Cited

U.S. PATENT DOCUMENTS

| | | | |
|---|---|---|---|
| 2004/0102041 A1* | 5/2004 | Okudaira ............ H01L 21/0332 | 438/689 |
| 2006/0063375 A1* | 3/2006 | Sun et al. ......... H01L 21/76843 | 438/629 |
| 2006/0196691 A1* | 9/2006 | Ahn et al. .............. H05K 1/162 | 174/256 |
| 2007/0036892 A1* | 2/2007 | Haukka et al. ... H01L 21/28562 | 427/248.1 |
| 2008/0148649 A1* | 6/2008 | Liu ..................... H01L 21/3212 | 51/298 |
| 2008/0318140 A1* | 12/2008 | Hayashi ................ G21K 1/062 | 430/5 |
| 2009/0224331 A1* | 9/2009 | Aoki ...................... H01L 27/228 | 257/379 |
| 2009/0280631 A1* | 11/2009 | Gambino et al. ... H01L 29/4966 | 438/588 |
| 2011/0089495 A1* | 4/2011 | Gluschenkov et al. ..................... H01L 21/823857 | 257/369 |
| 2012/0028373 A1* | 2/2012 | Belen et al. ............ H01L 43/12 | 438/3 |
| 2013/0171829 A1* | 7/2013 | Fitzsimmons ......... C09K 13/00 | 438/712 |
| 2014/0038412 A1* | 2/2014 | Hu .................... H01L 21/76811 | 438/689 |
| 2016/0351799 A1* | 12/2016 | Xue ....................... H01L 43/12 | |
| 2017/0076945 A1* | 3/2017 | Hudson ............. H01J 37/32908 | |
| 2018/0247863 A1* | 8/2018 | Briggs et al. ..... H01L 21/76816 | |
| 2018/0330986 A1* | 11/2018 | Briggs et al. ..... H01L 21/76816 | |
| 2019/0237331 A1* | 8/2019 | Lu ....................... H01L 21/0338 | |

* cited by examiner

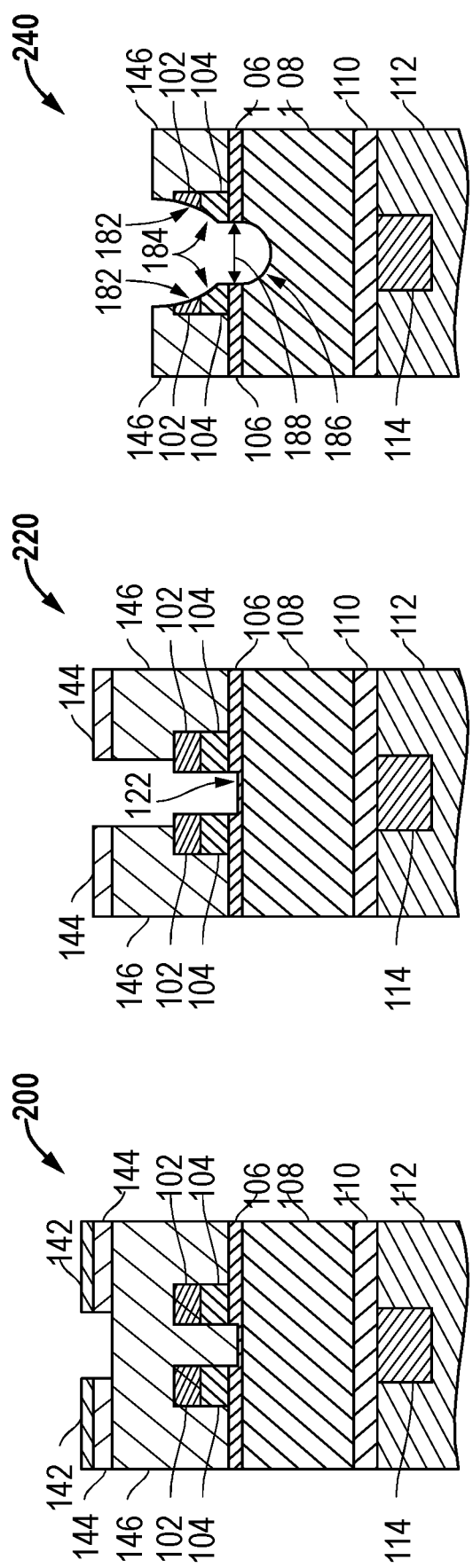

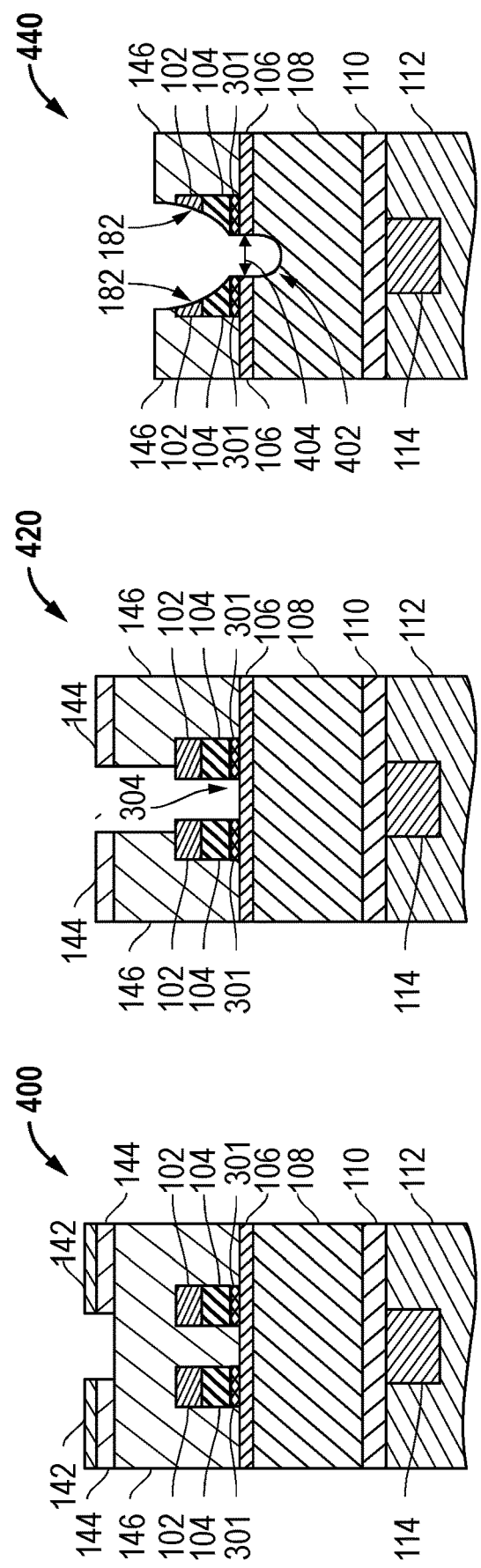

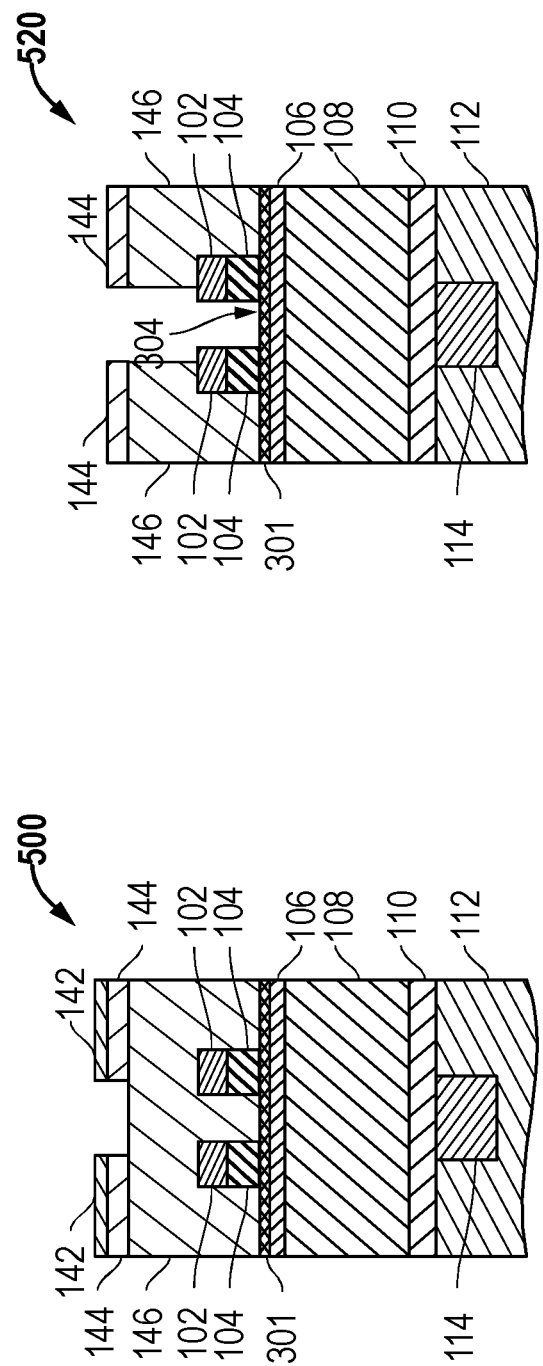

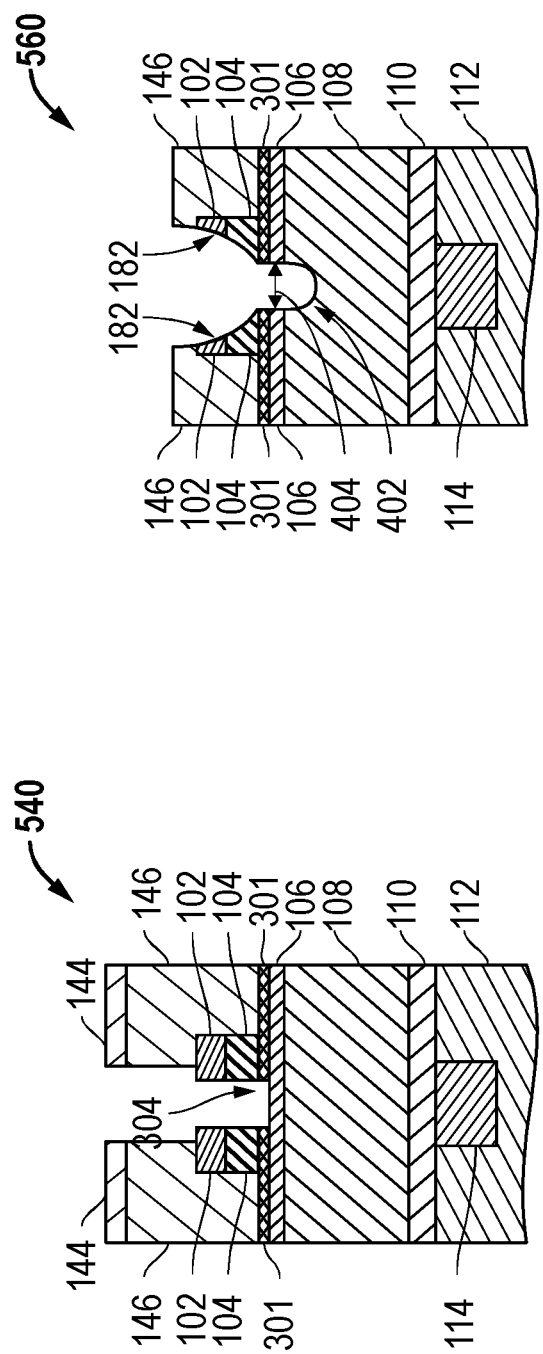

METHOD FOR USING ULTRA THIN RUTHENIUM METAL HARD MASK FOR ETCHING PROFILE CONTROL

This application claims priority to U.S. Provisional Patent Application No. 62/878,900, entitled, "Method and System For Developer Drain Monitoring," filed Jul. 26, 2019; and claims priority to U.S. Provisional Patent Application No. 62/880,256, entitled "Method For Using Ultra Thin Ruthenium Metal Hard Mask For Etching Profile Control," filed Jul. 30, 2019; both disclosures of which are expressly incorporated herein, in their entirety, by reference.

BACKGROUND

The present disclosure relates to the processing of substrates, such as for example microelectronic workpieces. In particular, it provides a novel method for patterning substrates. In one embodiment, the method may be for processing semiconductor substrates.

Device formation within microelectronic workpieces typically involves a series of manufacturing techniques related to the formation, patterning, and removal of a number of layers of material on a substrate. To meet the physical and electrical specifications of current and next generation devices, processing flows are reducing feature sizes while maintaining structure integrity for various patterning processes.

For some devices formed on microelectronic workpieces, vias are formed in one or more layers to reach conductive interconnects formed by a patterned conductive layer. Critical dimension (CD) for this via formation, such as using a back end of line (BEOL) etch process, typically needs to be precisely controlled to make electronic devices function properly. If the via CD is smaller than the targeted via CD, the via will be difficult to fill with a metal or conductive material during a metallization process step. Further, the resistance of metal interconnects formed in these smaller vias will increase because of the smaller metal cross-section area and its effect on electrical properties. If the via CD is larger than the targeted via CD, a short circuit might occur between two adjacent metal interconnects after the metallization, and this short circuit will likely lead to failure of the electronic device.

To facilitate the formation of vias within patterned structures for a microelectronic workpiece, prior process solutions have used metal hard mask (MHM) layers and hard mask (HM) layers as patterned masks to cover portions of underlying layers that are not to be etched. For example, titanium nitride (TiN) has been used as a material for MHM layers as it has a higher resistance to etching as compared to typical materials used for HM layers such as silicon nitride (SiN), silicon oxide (SiO2), silicon oxynitride (SiON), or other similar materials. For these prior process solutions, the MHM layer is formed on top of the HM layer to better control the via CD during an etch process to form patterned structures (e.g., BEOL etch to form dual damascene structures). However, a TiN MHM layer is still subject to being etched during the etch process to open the HM layer for formation of patterned structures including via formation. This undesired etching of the TiN MHM layer can cause a via CD that is larger than the target via CD and can cause poor local critical dimension uniformity (LCDU).

Prior solutions typically use TiN as a MHM layer that is formed over a SiN HM layer. Prior solutions may also include an additional HM layer over the TiN. However, when the TiN MHM layer is opened in a via open step so that a via can also be opened in the underlying SiN HM layer, the typical chemistries used for this etch (e.g., etch chemistries including chlorine (Cl2) and argon (Ar)) will also etch the underlying SiN HM layer and form gouging into the underlying SiN HM layer as shown in FIGS. 1A-B (Prior Art). Further, the level of gouging typically varies at different locations across the substrate; for example, due to variations in etch processes such as variations in reactive ion etch (RIE) lag. A denser pattern usually has a lower gouging level, and a less dense pattern usually has a higher gouging level. The different gouging levels will also cause a different via CD to form after the etch step used to etch underlying layers, such as etch steps for a underlying HM layer, an ultra-low dielectric constant (ULK) layer, a barrier low k (Blok) layer and/or other layers. Eventually, the final via CD for the contact vias to an underlying conductive layer, such as a metal (M) layer, will be significantly different from each other.

Looking now to FIG. 1A (Prior Art), an embodiment 100 is shown for multiple layers that have been formed on a microelectronic workpiece including a TiN layer 104 as a MHM layer and a SiN layer 106 as a HM layer. An oxide layer 102 (for example SiO2) has been formed and patterned over the TiN layer 104, acting as an additional HM as part of a MHM open process. Other layers underlying these layers 102/104/106 include a dielectric layer 108 such as a ULK layer, a Blok layer 110, and an additional dielectric layer 112. A conductive region 114, such as a metal (M) conductive region, has been formed within the dielectric layer 112. FIG. 1B (Prior Art) is an example embodiment 120 after an etch process has been used to remove portions of the TiN MHM layer 104 in order to open a via within the TiN MHM layer 104 vertically above the conductive region 114. This via within the TiN MHM layer 104 extends down to the SiN layer 106. However, the etch process for this via formation can leave a gouge 122 within the underlying SiN layer 106 as indicated above, and this gouge 122 causes the SiN layer 106 to be thinner than for other vias formed across a substrate for a microelectronic workpiece. Further, the amount of gouging can vary across the different vias, for example, due to variations in the etch process such as a variations in RIE lag.

Another issue with this use of TiN as a MHM material in prior solutions is that the TiN MHM layer is often eroded during subsequent etch process steps for underlying layers, such as etches to a underlying HM layer, a ULK layer, a Blok layer, and/or other underlying layers. As described herein, the chemistries used for opening these layers also tend to etch the TiN MHM layer. For example, a lateral etch can occur into the TiN MHM layer, and the top part of TiN MHM layer can also be consumed during these etches of underlying layers, as shown in FIGS. 2A-C. This undesired etching will cause the via CD to be larger than the targeted CD value. An undesired larger CD value can in turn generate short circuits with respect to the metal (M) contacts and/or cause more distorted via profiles in underlying layers (e.g., an ULK layer). Further, TiN residue will typically be generated during the via and trench etch steps from this lateral etching of the TiN MHM layer, and this residue can adversely affect the yield associated with the via opening processes and resulting electronic devices formed on the microelectronic workpiece.

Looking now to FIG. 2A (Prior Art), an embodiment 200 is shown for multiple layers that have been formed on a microelectronic workpiece. As with FIGS. 1A-B (Prior Art), the multiple layers include a dielectric layer 102, TiN layer 104 as a MHM layer that has been formed over a SiN layer 106 acting as a HM layer. Other layers include a dielectric layer 108 such as a ULK layer, a Blok layer 110, and a dielectric layer 112. In addition, an OPL (organic planarization layer) layer 146 has been formed over the structures shown in FIG. 1B (Prior Art) as a protection and planarization layer, and a silicon anti-reflective coating (SiARC) layer 144 and a photoresist (PR) layer 142 have been formed and patterned over the OPL layer 146.

FIG. 2B (Prior Art) is an example embodiment 220 after an etch process has been used to open a via within the OPL layer 146 vertically above the conductive region 114 down to the SiN layer 106. This via formation exposes the gouge 122 within the underlying SiN layer 106.

FIG. 2C (Prior Art) is an example embodiment 240 after a further etch process has been used to remove the SiN layer 106 within the via formed over the conductive region 114. The TiN layer 104 that is used as the MHM layer is often eroded as part of this further etch process. This erosion 184 in the TiN MHM layer 104, and similar erosion 182 in the oxide layer 102, leads to a larger critical dimension (CD) 188 for the via than the desired target CD. Further, the gouging 122 within the SiN layer 106 will also cause gouging 186 within the dielectric layer 112. Further, differences in the level of gouging 122 within the SiN layer 106 for different vias across a substrate will also cause different levels of gouging 186 within the dielectric layer 112 for these different vias. Ultimately, the CD variations and gouging variations lead to undesirable variations in the CD for vias that are later formed down to the conductive region 114, and these undesirable variations can lead to defects and performance issues in the final electronic devices formed within the microelectronic workpiece being manufactured.

It would be desirable to provide an improved patterning process.

SUMMARY

Embodiments are described herein that use an additional material for metal hard mask (MHM) layers to better control critical dimension (CD) in the formation of patterned structures including via formation to underlying layers, such as underlying patterned conductive layers. This additional material is provided as a ruthenium (Ru) layer, such as a Ru MHM layer implemented using Ru and/or a material containing Ru that has properties similar to Ru with respect to the process steps described herein. Further, other metals or metal containing materials can also be used that have properties similar to Ru with respect to the process steps described herein. In one embodiment, an Ru MHM layer can be placed under the TiN MHM layer to be utilized as a patterned mask layer to protect portions of underlying layers during an etch process, such as an etch process to form vias through underlying layers, for the manufacture of microelectronic workpieces. Adding a Ru MHM layer under the TiN MHM layer can better control the etch profile of the final structure and eliminate RIE lag because Ru has a high etch resistances to TiN etches and also higher etch resistance than TiN to many other BEOL etch recipes. In this manner, a MHM that is comprised of at least in part an underlying layer of Ru provides an improved substrate processing flow. Because of the high etch resistances seen by Ru to other etches, the Ru may be a thin Ru layer. Thus, the benefits described above may be received without the need for adding a thick process layer which could further complicate the patterning objectives. In one embodiment, the Ru layer may be a layer that is deposited through atomic layer deposition (ALD). In some embodiments, the Ru layer need only be 2-5 nm thick. Different or additional features, variations, materials, and embodiments can also be implemented, and related systems and methods can be utilized as well.

For one embodiment, a method of processing microelectronic workpieces is disclosed that includes forming a multi-layer MHM layer in which at least one lower layer of the multi-layer MHM is comprised of Ru. The Ru MHM layer may be an ALD Ru MHM layer formed over one or more underlying layers on a substrate. The ALD Ru MHM layer may be etched to provide a patterned ALD Ru MHM layer, and then the one or more underlying layers may be etched using, at least in part, the patterned ALD Ru MHM layer as a mask to protect portions of the one or more underlying layers.

In one embodiment of the techniques disclosed herein, a method of processing a substrate is provided. The method may comprise forming a multi-layer hard mask stack comprising at least a first metal hard mask layer and a second metal hard mask layer underlying the first metal hard mask layer, the second metal hard mask layer being a ruthenium metal hard mask layer comprising ruthenium, the multi-layer hard mask stack formed overlying over one or more underlying layers on the substrate. The method further comprises etching the multi-layer hard mask stack to provide a patterned ruthenium metal hard mask layer to expose portions of the one or more underlying layers, and etching the exposed portions of the one or more underlying layers using the patterned ruthenium metal hard mask layer as a mask to protect unexposed portions of the one or more underlying layers.

In one particular embodiment of the method, the ruthenium metal hard mask layer is a material comprising 95 percent or more of ruthenium (Ru). In another embodiment the ruthenium metal hard mask layer is a material comprising 70 percent or more of ruthenium. In another embodiment, the ruthenium metal hard mask layer is formed via atomic layer deposition and has a thickness of 20 nm or less. In another embodiment of the method, the ruthenium metal hard mask layer has a thickness of 10 nm or less. In another embodiment of the method, the method further comprising etching the ruthenium metal hard mask layer with a plasma etch process using a plasma comprising oxygen. In some embodiments, the etching of the one or more underlying layers comprises forming vias. In one embodiment of the method, one or more underlying layers comprise a dielectric hard mask layer. In one embodiment, the ruthenium metal hard mask layer is formed on top of the dielectric hard mask layer. In another embodiment, the first metal hard mask layer is a titanium nitride layer. In another embodiment, the hard mask layer comprises at least one of SiN, SiO2, or SiON.

In one alternative embodiment of the method(s) described above, the ruthenium metal hard mask layer is formed via atomic layer deposition and has a thickness of 20 nm or less, and the etching of the multi-layer hard mask comprises a first etch process to etch the first metal hard mask layer and a second etch process to etch the ruthenium metal hard mask layer, the first etch process and the second etch process being different, additional patterned layers not being formed above the multi-layer hard mask between performing the first etch process and performing the second etch process. In a second alternative embodiment of the method(s) described above, the ruthenium metal hard mask layer is formed via atomic layer deposition and has a thickness of 20 nm or less and the etching of the multi-layer hard mask comprises a first etch process to etch the first metal hard mask layer and a second etch process to etch the ruthenium metal hard mask layer, the first etch process and the second etch process being different, additional patterned layers being formed above the multi-layer hard mask after performing the first etch process but before performing the second etch process.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 2A-2C (Prior Art) provide example embodiments for a traditional process flow for forming a via is formed into a layer underlying a MHM layer and a HM layer in which lateral erosion of the MHM layer occurs.

FIGS. 4A-4C provide example embodiments for a process flow which may be performed after the process flow of FIGS. 3A-3C.

FIGS. 5A-5D provide example embodiments for a process flow which may be performed after the process flow of FIGS. 3A-3B.

DETAILED DESCRIPTION

Figures 1A, 1B:
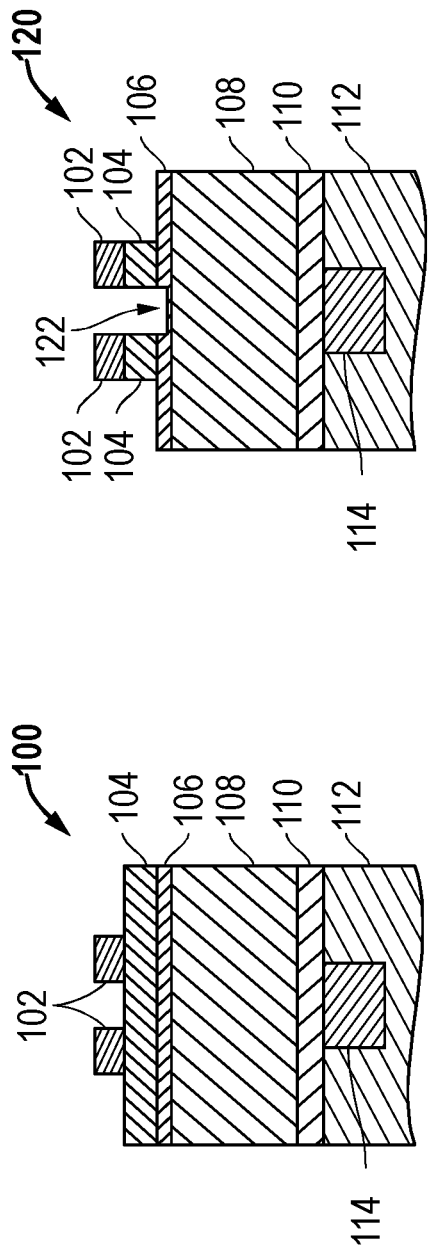
FIGS. 1A-1B illustrate example embodiments for a traditional process flow where an opening is formed within a MHM layer to reach a HM layer.

Embodiments are described herein that use an additional material for MHM layers to better control critical CDs in the formation of patterned structures including via formation to underlying layers, such as underlying patterned conductive layers. This additional material is provided as a Ru layer, such as a Ru MHM layer implemented using Ru and/or a material containing Ru that has properties similar to Ru with respect to the process steps described herein. Further, other metals or metal containing materials can also be used that have properties similar to Ru with respect to the process steps described herein. In one embodiment, an Ru MHM layer can be placed under a TiN MHM layer so as to be utilized as a patterned mask layer to protect portions of underlying layers during an etch process. In one embodiment the etch process is used to form vias through underlying layers for the manufacture of microelectronic workpieces. Adding a Ru MHM layer under the Tin MHM layer can better control the etch profile of the final structure and eliminate RIE lag because Ru has a high etch resistances to TiN etches and also higher etch resistance than TiN to other BEOL etch recipes. Thus, the profile of the pattern that is being etched may be better controlled and the effects of gouging of the HM layer may be negated.

In this manner, a multi-layered MHM that is comprised of at least in part an underlying layer of Ru provides an improved substrate processing flow. Because of the high etch resistances seen by Ru to other etches, the Ru may be a thin Ru layer. Thus, the benefits described above may be received without the need for adding a thick process layer which could further complicate the patterning objectives. In one embodiment, the Ru layer may be a layer that is deposited through atomic layer deposition (ALD). In some embodiments, the Ru layer need only be 2-5 nm thick. Different or additional features, variations, materials, and embodiments can also be implemented, and related systems and methods can be utilized as well.

For one embodiment, a method of processing microelectronic workpieces is disclosed that includes forming a multi-layer MHM layer in which at least one lower layer of the multi-layer MHM is comprised of Ru. The Ru MHM layer may be an ALD Ru MHM layer formed over one or more underlying layers on a substrate. The ALD Ru MHM layer may be etched to provide a patterned ALD Ru MHM layer. Then the one or more underlying layers may be etched using, at least in part, the patterned ALD Ru MHM layer as a mask to protect portions of the one or more underlying layers.

FIGS. 3A-5D illustrate exemplary process flows illustrating use of the concepts described herein. It will be recognized that these process flows are merely exemplary and the concepts described herein may be utilized in many other process flows, all as would be well understood by one skilled in the art.

Thus, for example as shown in the figures, in one embodiment to better control the via CD in underlying layers (e.g., an ultra-low dielectric constant (ULK) layer), the embodiments disclosed herein introduce Ru as a layer underlying a MHM layer with the Ru layer deposited on one or more underlying layers of a substrate. In one embodiment the underlying layer may be a conventional hard mask layer including SiN, SiO2, SiON, combinations thereof, and/or similar materials. A Ru MHM layer can be implemented using Ru and/or a material containing Ru that has properties similar to Ru with respect to the process steps described herein. The typical MHM etches used to etch MHM layers, such as for example TiN, may have a high etch selectivity to Ru containing layers. Further, the etches used to etch the Ru MHM layer may have a high etch selectivity to the layers underlying the Ru layer (as compared to conventional MHM etch processes) because Ru is not etched or is insignificantly etched by typical etch chemistries (e.g., Cl2, N2, Ar, and $C_xF_y$ plasma chemistries) used for etching typical TiN layers, HM layers, and for the layers underlying the HM layer. For example, other typical layers underlying HM layers include ULK layers and Blok layers. Ru is typically etched effectively, for example, using oxygen (O2) based chemistry to form RuO4. Other gases which may be added to the etch include N2, Cl2 and/or Ar. Thus, Ru is not eroded during standard etch processes, such as standard BEOL etch processes, and the Ru MHM layers will keep their original profile and thickness. This lack of erosion using Ru MHM layers allows for better control of CD in the formation of patterned structures such as vias.

Moreover, due to the high etch selectivity, the thickness of the Ru layer underlying the MHM layer (for example underlying a TiN MHM layer) may be very thin. In one embodiment, the Ru containing layer may be 20 nm or less. In another embodiment, the Ru containing layer may be less than 10 nm. In yet another embodiment, the Ru containing layer may be 2-5 nm. Because the Ru layers may achieve the desired purposes described herein at such small thickness levels, the impact of the addition of the Ru layer on other process variables of the process flow may be minimized.

The Ru MHM layer techniques described herein can be applied to current etch processes, such as for example, a typical BEOL process integration flow. The disclosed embodiments also effectively address issues of via CD distortions and RIE lag experienced where deposition-etch-combined solutions are used instead of etch-only solutions. The Ru MHM layers can be removed ex-situ by wet cleaning or surface etching and cleaning. Further, Ru layers can also be removed in-situ in the same etch chamber used for via formation with Ru etch chemistries. Further, due to the thin nature of the Ru layer, the Ru layer can be easily removed by a chemical mechanical planarization (CMP) process.

In contrast with prior solutions, the embodiments described herein that use a Ru MHM layer underlying a MHM layer provide significant advantages over prior MHM solutions. First, the upper MHM layer (for example a TiN MHM layer) may be effectively etched without gouging of the Ru MHM layer due to the selective nature of TiN etches have to Ru containing layers. Then, because the Ru MHM layer may be etched effectively by O2 based chemistries and these chemistries have higher selectivity to typical hard mask layers (for example, hard mask layers using SiN, SiO2, SiON, or similar materials) for the HM layer, the etch process steps used to open vias within the Ru MHM layer can better stop on the underlying HM layer without gouging into this underlying HM layer. Therefore, very little, if any, gouging will occur into the HM layer, and the RIE lag issue experienced in prior solutions for following etch steps can be more effectively suppressed. Further, the high etch resistance of the Ru MHM layer allows the Ru MHM layer not to be eroded during following etch steps for additional underlying layers (e.g., ULK layer, Blok layer, and/or other underlying layers). For example, the Ru MHM layer will not be eroded by (1) typical HM etches such as fluorocarbon based etches (in one example carbon tetrafluoride and argon etch), (2) typical low-k dielectric layer etches and Blok etches (in one example a CHxFy/N2/Ar etch), and (2) certain ash steps such as used in N2/H2 or CO2 ash processes.

As recognized in the disclosed embodiments, therefore, Ru provides an advantageous material to use as an additional layer underlying typical MHM layers in order to keep the via CD at a desired or target parameter. The yield of via opening processes will also be more stable because there is no Ru impurity generated in the via during the via formation and trench etch processes.

Advantages of the disclosed embodiments that use Ru MHM layers include, but are not limited to, the following: (1) effectively eliminate RIE lag (e.g., little to no gouging in the Ru layer by the TiN etch and little to no gouging of the HM layer which can include SiN, SiO2, SiON, or other similar material); (2) better control of via CD (e.g., no erosion of Ru MHM layer during the via and trench etch steps); and (3) help to ensure the yield of via opening processes (e.g., no Ru residue generated during the via formation and trench etch steps).

For one disclosed embodiment, a Ru layer is formed as an additional MHM layer (1) under an upper MHM layer (for example a TiN layer), and (2) over a HM layer, such as a SiN HM layer. For one embodiment, the Ru layer is formed using one or more depositions steps. The Ru layer may be formed by any of a wide variety of deposition processes including chemical vapor deposition, plasma deposition, etc., as is well known in the art. In one preferred embodiment, a thin Ru layer may be formed utilizing atomic layer deposition techniques, again techniques known in the art.

Looking to FIGS. 3A-C, FIGS. 4A-C, and 5A-D, process steps are shown for formation of vias where a Ru MHM layer is used under an upper MHM layer to protect underlying layers and improve CD control. As shown in FIGS. 3A-C, FIGS. 4A-D, and 5A-D, alternative process flows are disclosed. However, these process flows are merely examples of process flows which may incorporate the techniques disclosed herein and other flows may be utilized. In a first exemplary embodiment, a process flow includes the process steps shown in FIGS. 3A, 3B, 3C, 4A, 4B, and 4C. A second exemplary embodiment incorporates the steps shown in FIGS. 3A, 3B, 5A, 5B, 5C and 5D.

Figure 3A:
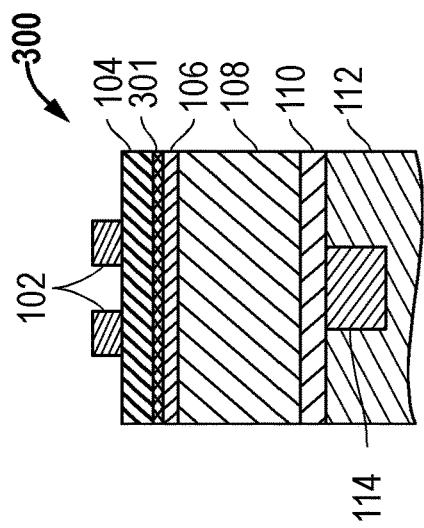
FIGS. 3A-3C provide example embodiments for a process flow where a multi-layer MHM is utilized in which a ruthenium or a material including ruthenium is used as a lower MHM during formation of an opening within the multi-layer MHM to reach an underlying HM layer.

As shown in FIG. 3A, an embodiment 300 is shown for multiple layers that have been formed on a microelectronic workpiece including a Ru layer 301 as an additional MHM layer that has been formed under an upper MHM layer (such as upper TiN layer 104) and formed over an underlying HM layer (such as underlying SiN layer 106). The multiple layers also include a dielectric layer 108 such as an ultra-low dielectric (k) layer, a Blok layer 110, and a dielectric layer 112. A conductive region 114, such as a metal (M) conductive region, has been formed within the dielectric layer 112. An oxide layer 102 has been formed and patterned as a hard mask layer over the metal hard mask layers (TiN layer 104 and Ru layer 302) as part of the patterning process, for example using known lithography techniques. Thus, as compared to the prior art techniques such as seen in FIG. 1, the embodiment 300 of FIG. 3A includes a thin additional MHM layer (in this case, Ru layer 301) under another MHM layer.

Figure 3B:
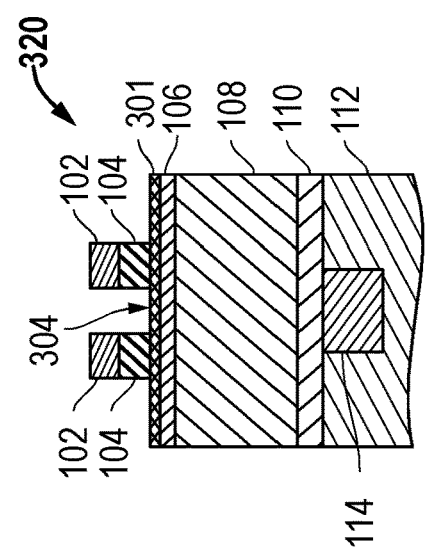

FIG. 3B is an example embodiment 320 after an etch process has been used to remove portions of the TiN layer 104 to open a via within the TiN Layer 104 above the conductive region 114. As shown in FIG. 3B, due to the etch resistance of the Ru layer 301, the etch of the upper MHM layer (the TiN layer 104) may be accomplished without gouging the Ru layer 301. Thus, unlike prior solutions, this via formation through the TiN layer 104 does not leave a gouged area because the TiN etch has a high selectivity to the Ru MHM layer underling the TiN. Also, the gouging in region 304 across multiple vias remains at the same level independent of width of the region.

Figure 3C:
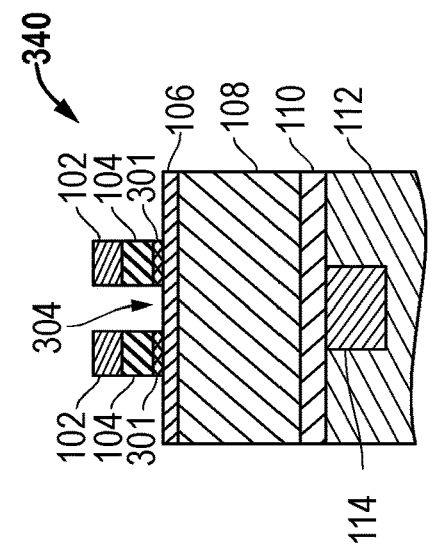

After processing of FIG. 3B, alternative process flows may be followed. In a first process flow (FIGS. 3C, 4A, 4B, and 4C), the Ru layer 301 may be etched as shown in FIG. 3C. Thus, in this process flow the Ru layer 301 is etched before the addition of subsequent process layers being formed above the structure shown in FIG. 3C. As mentioned herein, in one embodiment the etch of the Ru layer 301 may be a plasma etch using an O2 based chemistry. Because of the high selectivity of the O2 chemistry to the underlying HM layer (for example SiN layer 106), the Ru layer 301 may be etched without etching into the underlying HM layer as shown in FIG. 3C (in contrast to the process flow such as shown above in prior art FIG. 1B).

Looking now to FIG. 4A, an embodiment 400 is shown for multiple layers that have been formed on a microelectronic workpiece with the inclusion of additional layers subsequently being formed above the process step of the embodiment 340 of FIG. 3C. As shown in FIG. 4A, an OPL layer 146 has been formed as a planarization and protection layer over the structures of FIG. 3C. Further, a SiARC layer 144 and a PR layer 142 have been formed and patterned over the OPL layer 146. The additional layers of FIG. 4A are merely shown as examples and other stacks and other patterning techniques may be utilized. One alternative process may be, for example, a stack of OPL, SiON, bottom anti-reflective coating (BARC) and PR layers.

FIG. 4B is an example embodiment 420 after an etch process has been used to open a via within the OPL layer 146 above the conductive region 114 down to the SiN layer 106. This via formation exposes the region 304 to the underlying SiN layer 106 as shown in FIG. 4B. However, it will be recognized that the OPL layer may also etch the upper HM layer, in which case the OPL etch would stop on the TiN layer 104. Still further in another embodiment, the OPL etch may also etch (all or partially) the combination of the oxide layer 102 and TiN layer 104 and stop on the Ru layer 301. Next, FIG. 4C is an example embodiment 440 after a further etch process has been used to remove the SiN layer 106. In contrast with prior solutions, the Ru layer 301 is not eroded as part of this further etch process. Even though there is still erosion 182 in the oxide layer 102 and even the TiN layer 104, the lack of erosion in the Ru layer 301 leads to improved control of the critical dimension (CD) 404 for vias formed through SiN layer 106. Further, gouging 402 (into the underlying dielectric layer 108 caused by the SiN layer 106 etch), if present, can be better controlled (or eliminated) and confined to the desired critical dimension, and any gouging 402 will also be more consistent with respect to different vias across the substrate for the microelectronic workpiece. This consistency leads to consistent CD for vias that are later formed down to the conductive region 114, thereby improving performance of final electronic devices formed within the microelectronic workpiece being manufactured.

As mentioned above, an alternative process flow after the process step of FIG. 3B may occur. Specifically, the process flow may proceed from the step of FIG. 3B to the steps of FIGS. 5A-5D. In this alternative process flow, additional layers may be being formed above the Ru layer 301 before the Ru layer 301 is etched. Thus, as shown in embodiment 500 of FIG. 5A, after the processing of FIG. 3B, an OPL layer 146 has been formed over the structures as a planarization and protection layer. Further, a SiARC layer 144 and a PR layer 142 have been formed and patterned over the OPL layer 146.

FIG. 5B is an example embodiment 520 after an etch process has been used to open a via within the OPL layer 146 above the conductive region 114 down to the Ru layer 301. This via formation exposes the region 304 to the underlying Ru layer 301 to the HM layer above the TiN layer 104 (the oxide layer 102 in this embodiment). However, it will be recognized that the OPL layer may also etch the upper HM layer, in which case the OPL etch would stop on the TiN layer 104. Still further in another embodiment, the OPL etch may also etch (all or partially) the combination of oxide layer 102 and TiN layer 104 and stop on the Ru layer 301. Then as shown in the embodiment 540 of FIG. 5C, the Ru layer 301 may be etched in region 304, for example using an etch that is etches Ru but is selective to the underlying hard mask layer. In the example shown, the Ru etch may be an oxygen based plasma etch. This exposes the region 304 to the underlying SiN layer 106. FIG. 5D is an example embodiment 560 after a further etch process has been used to remove the SiN layer 106. In contrast with prior solutions, the Ru layer 301 is not eroded as part of this further etch process. Even though there may still be erosion 182 in the oxide layer 102 and even the TiN layer 104, the lack of erosion in the Ru layer 301 leads to improved control of the critical dimension (CD) 404 for vias formed through SiN layer 106. Further, gouging 402 (into the underlying dielectric layer 108 caused by the SiN layer 106 etch), if present, can be better controlled (or eliminated) and confined to the desired critical dimension, and any gouging 402 will also be more consistent with respect to different vias across the substrate for the microelectronic workpiece. This consistency leads to consistent CD for vias that are later formed down to the conductive region 114, thereby improving performance of final electronic devices formed within the microelectronic workpiece being manufactured.

Thus, as described above a masking layer can be used to open and expose portions of a multi-layer HM and MHM structure. In one embodiment, the MHM is comprised of at least two layers: an upper MHM layer and a Ru layer. In another embodiment, the multi-layer HM and MHM structure may comprise an upper hard mask and a lower HM between which a multi-layer MHM structure is formed, at least one layer of the multi-layer MHM being a Ru layer underlying another MHM layer. The Ru layer may be etched, for example by O2 plasma, without gouging into the lower HM layer as shown in FIGS. 3C and 5C. After Ru etching to form patterns in the Ru MHM layer using one or more etch process steps, additional layers can be deposited. These layers may include an OPL layer, a SiARC layer, and a PR layer, for example, that are deposited by spin-on coating on top of the HM and MHM layers. However, it will be recognized that other and different layers may be utilized above the HM and MHM depending upon the particular process flow which is incorporating the concepts described herein.

In contrast to prior art solutions, the lower HM layer may be protected from being gouged by the use of the Ru MHM layer. Further, the etch characteristics of Ru etches allows for the Ru layer to be etched without gouging of the underlying HM layer. Further, the lack of erosion of the Ru layer during the etching of various layers underlying the Ru layer allows for the Ru MHM layer to maintain its desired via CD without erosion as also shown in FIGS. 4A-C and 5A-5D. This lack of erosion in the Ru MHM layer allows for more precise control of the via CD and other advantages as described herein.

After the processing of the substrate through the process steps of FIG. 4C or 5D, additional etching may be performed to open the via to the conductive region 114. For example, the dielectric layer 108 (in one embodiment a ULK layer) can be opened to form vias to underlying layers such as a Blok layer 110. Eventually, the via formation may be completed by etching the Blok layer 110 (either in combination with the etch of the dielectric layer 108 or as a separate additional process step). For example, the underlying Blok layer can also be fully opened during the etch of the SiN HM layer and the ULK layer. Alternatively, an extra Blok etching step can also be used to completely open the via through the Blok layer to the underlying patterned conductive layer (e.g., metal layer). After that, intervening layers (e.g., the OPL) can be removed (in one example using an ash step) so that the HM layer and the MHM layer can be exposed.

In one exemplary embodiment, once the via formation has been completed, for example, where the via lands on a metal (M) layer or other conductive layer, a post etch treatment (PET) can be used for residue removal from the via bottom and sidewall. After the PET step, the remaining parts of the HM layer and the MHM layer may be removed by either ex-situ or in-situ methods using various known, wet etch, dry etch or CMP techniques, alone or in combination. The techniques of utilizing a thin Ru layer (for example an ALD Ru layer) are particularly beneficial with regard to the subsequent removal of the Ru layer. For example, thin Ru layers may be removed through CMP processes while the removal of thicker Ru layer is not as effective using CMP processes. Plasma etching of the thin Ru layer may also be more easily accomplish due to the thin nature of the disclosed Ru layer.

The microelectronic workpiece can also be continuously processed for the later metal filling within the vias that were formed. Thus, one or more metallization process steps can be used to provide this metal filling within the vias. Other variations could also be implemented.

With respect to the Ru MHM layer, the layer can be made from Ru or can be made from a material containing Ru. For one example embodiment, the Ru MHM layer is a material including 95 percent or more of Ru. For another example embodiment, the Ru MHM layer is a material including 70 percent or more of Ru. Thus, it will be recognized that a ruthenium layer containing other materials may be utilized as the Ru layer as long as the layer can be used as an etch stop for the overlying layers and properly removed without gouging the underlying layers as described herein Further, as mentioned above, the etch techniques to etch the MHM layer above the Ru layer may have a high selectivity to the Ru layer. For example, a Cl2/Ar etch utilized to etch a TiN MHM layer overlying a Ru layer may have a selectivity to the Ru such that the TiN etch rate is at least of at least 5 times greater than the Ru etch rate in one embodiment and at least 10 times greater in another embodiment. Further, the etch used to etch the Ru MHM layer for the embodiments described herein preferably has a selectivity to the next underlying layer of at least 10 or greater. As such, the etch rate with respect to the Ru MHM layer will be at least 10 times or greater than the etch rate for the next underlying layer for a selected etch chemistry and process. As one example, the etch rate for the Ru MHM layer is at least 10 times or greater than a HM layer (for example SiN, SiO2 or SiON) that is the next underlying adjacent to the Ru MHM layer. For other embodiments, the Ru MHM layer has a selectivity to the next underlying layer of at least 5 or greater with respect to one or more underlying layers. As one further example, a SiN HM layer is used as the next underlying adjacent layer and O2 etch chemistries are used. Other variations can also be implemented.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), sputter deposition, and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Thus, for example, the Ru layer may be formed by any of a wide variety of techniques that may be utilized to form the ruthenium. For example, atomic layer deposition processes, sputtering processes, chemical vapor deposition processes, and/or plasma deposition processes, etc. may be utilized. In one example, the ruthenium layer is formed by the use of an atomic layer deposition process which utilizes ruthenium containing precursors or their derivatives. It will be recognized that other processes may be utilized as the techniques described herein are not limited to specific techniques for forming the ruthenium layer.

As mentioned, in one embodiment, the Ru layer may be deposited via an ALD process. In a preferred embodiment, the Ru layer may be an ALD layer of less than 20 nm, or more preferred less than 10 nm and in one embodiment between 2-5 nm thick. However, it will be recognized that the concepts described herein may be utilized with other Ru formation techniques. In this manner a relatively thin Ru MHM layer is provided as to the thicknesses of the other MHM and HM layers. For example, for use with Ru layer thicknesses described above exemplary example HM layer thicknesses may range, for example, from about 20 to 30 nm and other MHM layers (such as TiN layer 104) may range, for example from about 20 to 30 nm.

Lithography processes with respect to PR layers can be implemented using optical lithography, extreme ultra-violet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

The techniques disclosed herein may be utilized during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow, for example any of the numerous photolithography steps which may be utilized to form a completed substrate.

Figure 6:
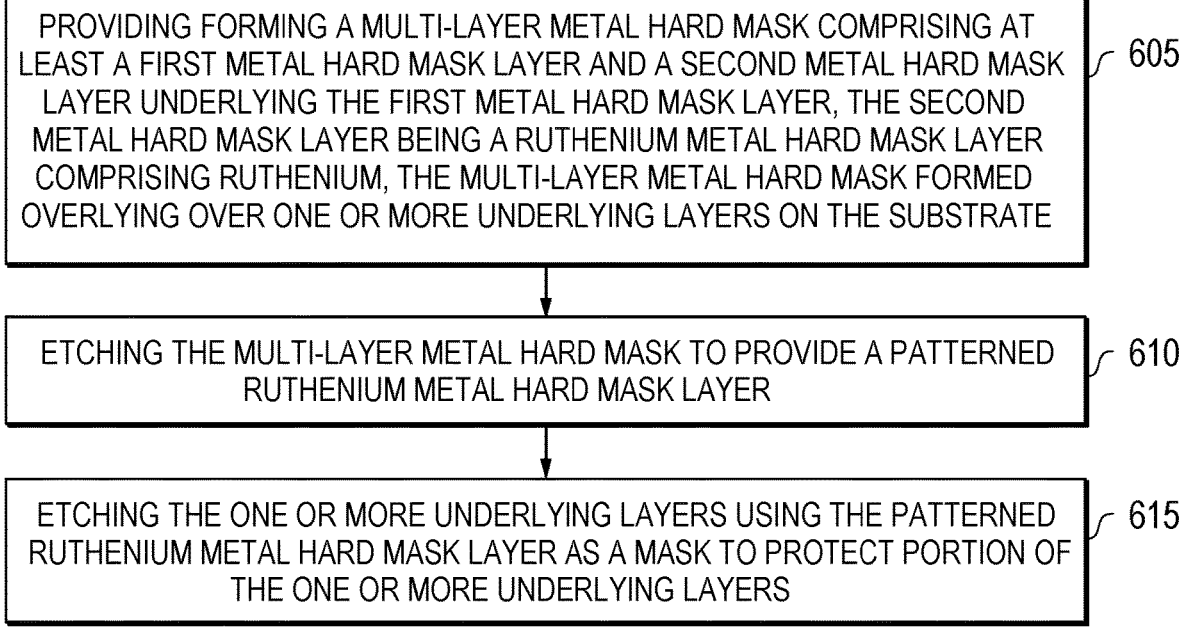
FIG. 6 illustrates an exemplary method utilizing the techniques described herein.

FIG. 6 illustrates an exemplary method for use of the processing techniques described herein. It will be recognized that the embodiment of FIG. 6 is merely exemplary and additional methods may utilize the techniques described herein. Further, additional processing steps may be added to the method shown in the FIG. 6 as the steps described are not intended to be exclusive. Moreover, the order of the steps is not limited to the order shown in the figure as different orders may occur and/or various steps may be performed in combination or at the same time.

FIG. 6 illustrates an exemplary method for processing a substrate. The method comprises step 605 of forming a multi-layer metal hard mask comprising at least a first metal hard mask layer and a second metal hard mask layer underlying the first metal hard mask layer, the second metal hard mask layer being a ruthenium metal hard mask layer comprising ruthenium, the multi-layer metal hard mask formed overlying over one or more underlying layers on the substrate. The method further comprises step 610 of etching the multi-layer metal hard mask to provide a patterned ruthenium metal hard mask layer. The method further comprises step 615 of etching the one or more underlying layers using the patterned ruthenium metal hard mask layer as a mask to protect portion of the one or more underlying layers.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of processing a substrate, comprising:
   forming a multi-layer hard mask stack comprising at least a first metal hard mask layer and a second metal hard mask layer underlying the first metal hard mask layer, the second metal hard mask layer being a ruthenium metal hard mask layer comprising ruthenium, the multi-layer hard mask stack formed overlying over one or more underlying layers on the substrate, the one or more underlying layers comprising a dielectric hard mask;
   etching the multi-layer hard mask stack to provide a patterned ruthenium metal hard mask layer to expose portions of the one or more underlying layers, by using a first etch process to etch the first metal hard mask layer and a second etch process to etch the ruthenium metal hard mask layer, the first etch process and the second etch process being different, additional patterned layers not being formed above the multi-layer hard mask between performing the first etch process and performing the second etch process; and
   etching the exposed portions of the one or more underlying layers using the patterned ruthenium metal hard mask layer as a mask to protect unexposed portions of the one or more underlying layers, etching the exposed portions of the one or more underlying layers comprising etching portions of the dielectric hard mask layer.

2. The method of claim 1, wherein the ruthenium metal hard mask layer is a material comprising 95 percent or more of ruthenium.

3. The method of claim 1, wherein the ruthenium metal hard mask layer is a material comprising 70 percent or more of ruthenium.

4. The method of claim 3, wherein the ruthenium metal hard mask layer is formed via atomic layer deposition and has a thickness of 20 nm or less.

5. The method of claim 4, wherein the ruthenium metal hard mask layer has a thickness of 10 nm or less.

6. The method of claim 5, further comprising etching the ruthenium metal hard mask layer with a plasma etch process using a plasma comprising oxygen.

7. The method of claim 1, wherein the ruthenium metal hard mask layer has a thickness of 20 nm or less.

8. The method of claim 1, wherein the etching of the one or more underlying layers comprises forming vias.

9. The method of claim 1, wherein the ruthenium metal hard mask layer has a thickness of 10 nm or less.

10. The method of claim 9, wherein the ruthenium metal hard mask layer is formed on top of the dielectric hard mask layer by utilizing an atomic layer deposition process, the method further comprising etching the ruthenium metal hard mask layer with a plasma etch process using a plasma comprising oxygen.

11. The method of claim 1, wherein the ruthenium metal hard mask layer is formed on top of the dielectric hard mask layer.

12. The method of claim 1, wherein the first metal hard mask layer is a titanium nitride layer.

13. The method of claim 1, wherein the dielectric hard mask layer comprises at least one of SiN, SiO2, or SiON.

14. The method of claim 1, the second etch process comprising an oxygen based plasma etch.

15. The method of claim 14, wherein the etching of the one or more underlying layers comprises forming vias.

* * * * *